United States Patent [19]

Riffle et al.

[11] Patent Number: 6,090,486
[45] Date of Patent: Jul. 18, 2000

[54] FIBER MATERIALS FOR MANUFACTURING FIBER REINFORCED PHENOLIC COMPOSITES AND ADHESIVES WITH NUCLEOPHILIC INITIATORS POSITIONED ON THE FIBER SURFACES

[75] Inventors: Judy S. Riffle; Christy S. Tyberg; James E. McGrath, all of Blacksburg, Va.

[73] Assignee: Virginia Polytechnic Institute & State University, Blacksburg, Va.

[21] Appl. No.: 09/296,530

[22] Filed: Apr. 22, 1999

Related U.S. Application Data

[60] Provisional application No. 60/082,596, Apr. 22, 1998.

[51] Int. Cl.$^7$ .................................................. D02G 3/00
[52] U.S. Cl. ..................... 428/373; 428/374; 428/375; 428/378; 428/380
[58] Field of Search .................................. 428/373, 374, 428/375, 378, 380; 427/407.1

[56] References Cited

U.S. PATENT DOCUMENTS 5,608,034  3/1997  Falling et al. ............................ 528/409

*Primary Examiner*—Richard Weisberger
*Attorney, Agent, or Firm*—Whitham, Curtis & Whitham

[57] ABSTRACT

Fiber reinforced thermosetting matrix materials are advantageously created using fibers that are coated with a coating containing a nucleophilic initiator or have a surface treatment which creates a nucleophilic initiator on the surface. The fibers are combined with the thermosetting matrix materials just before curing of the matrix material is desired. These fibers and this methodology avoid premature curing, allow higher levels of initiator to be used to ensure rapid cure, and allow the thermosetting matrix materials to be heated to reduce viscosity.

15 Claims, 2 Drawing Sheets

FIBER MATERIALS FOR MANUFACTURING FIBER REINFORCED PHENOLIC COMPOSITES AND ADHESIVES WITH NUCLEOPHILIC INITIATORS POSITIONED ON THE FIBER SURFACES

This appln claims the benefit of U.S. Provisional No. 60/082,596 filed Apr. 22, 1998.

BACKGROUND OF THE INVENTION

1. Field of the Invention

The present invention generally relates to the immobilization of nucleophilic initiators for curing thermosetting resins, such as mixed phenolic/epoxy thermosetting resins, directly on reinforcing fibers used to reinforce the matrix created from the thermosetting resins, as well as the creation of nucleophilic initiators on the surface of the reinforcing fibers. Specifically, the nucleophilic initiators are immobilized in a polymeric fiber coating or the fiber coating itself is the initiator.

2. Background Description

Fabrication processes for making fiber reinforced polymer matrix composites and fiber reinforced adhesives include a step whereby the fibers are brought into intimate contact with the resin. If the resin is a thermosetting material, the resin is desirably cured after the fibers and matrix are brought into contact. The resin must not cure prematurely, yet for many processes, rapid cures are desirable during composite formation. These two requirements are often conflicting. Oftentimes, if the initiator is added directly to the resin, premature cure occurs.

With novolac-epoxy resins, nucleophilic initiators for novolac-epoxy resins are normally nucleophiles such as tertiary phosphines or tertiary amines. Novolac-epoxy resins are relatively high viscosity resins and, as such, are currently processed from solution. Elevated temperatures in a resin "pre-fabrication bath" will be required for melt processes such as melt pregging, pultrusion, pressure injection, or filament winding. If sufficient initiator for resin cure is added to obtain rapid reaction during composite fabrication, premature curing in the resin pre-bath is a problem.

SUMMARY OF THE INVENTION

It is therefore an object of the present invention to provide a fiber material having a polymer coating which contains or is itself a nucleophilic initiator for curing a matrix resin or adhesive.

It is another object to provide a method of manufacture of the coated fiber material which limits premature curing of a matrix resin.

According to the invention, the nucleophilic initiators are either immobilized in a polymeric fiber coating or actually comprise the fiber coating. Thus, the initiator does not come into contact with the resin until the fibers and resin are combined. This prevents premature curing, yet allows for sufficient initiator to be used to ensure rapid composite or adhesive curing when desired.

Dispersing the nucleophilic initiator in the fiber sizing, or alternatively using a fiber sizing which is itself a nucleophilic initiator, eliminates the need for an initiator being added to the resin prefabrication bath. Thus, for example, with the novolac-epoxy resins, the resins can be heated to temperatures where the resin viscosity is quite low for extended periods without any premature curing. It also allows for higher initiator concentrations than normal to be used. This is desirable because reactions rapid enough for continuous processes such as pultrusion and filament winding become accessible.

The invention differs from the present technology in that the matrix initiator does not contact the thermosetting matrix resin or the adhesive resin until the fibers and matrix are combined. Normally, nucleophilic initiators for such resins are added directly to the resin, and then the mixture is applied to the fibers. This invention circumvents problems associated with premature curing, particularly in cases whereby either the resin must be heated prior to application, or cases whereby rapid cure reactions are needed which require relatively high initiator concentrations. Hence, this invention has advantages in allowing for the use of high initiator concentrations whereby cure reactions will be rapid particularly for continuous fabrication processes). It also has the advantage of allowing for preheating resins in resin pre-baths to relatively high temperatures in order to reduce viscosities and obtain good fiber and preform wet out. This preheat advantage has particular application when phenolic/epoxy thermosetting resins such as novalac-epoxies are used.

This invention has a variety of utilities including fiber reinforced composites or fiber reinforced adhesives in infrastructure, construction, infrastructure and construction repair, transportation (aircraft, ships, automotive), sporting goods, off shore oil recovery, printed wiring boards, and chemical and industrial plant construction. Particular uses include cost sensitive applications where rapid fabrication processes are essential and, where flame retardance is needed.

BRIEF DESCRIPTION OF THE DRAWINGS

The invention can be better understood from the detailed description of the invention with reference to the drawings, in which.

DETAILED DESCRIPTION OF A PREFERRED EMBODIMENT OF THE INVENTION

Figure 1:
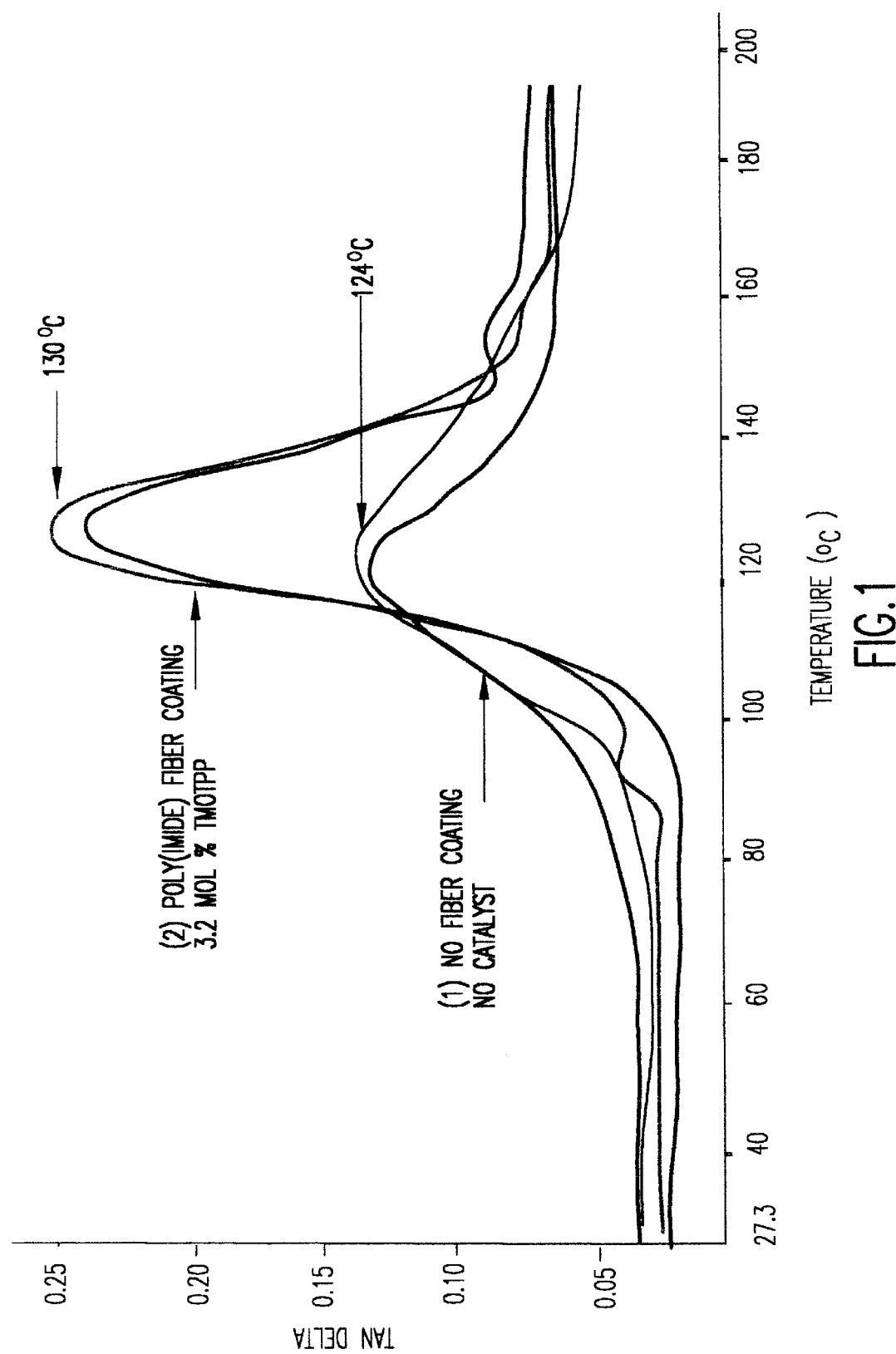
FIG. 1 is a graph showing tangent curves measured by dynamic mechanical analysis used to determine glass transition temperatures of cured carbon fiber reinforced novolac-epoxy composites.

In one embodiment, the inventive fiber material is constructed by coating a surface of a fiber with a nucleophilic initiator. The coated fiber can then be brought into contact with a thermosetting polymer matrix material, such as phenolic/epoxy matrix materials, to effect rapid curing of the matrix materials with the fibers in place. The nucleophilic initiator may be a product of a reaction between a base and a phenolic resin having the structure:

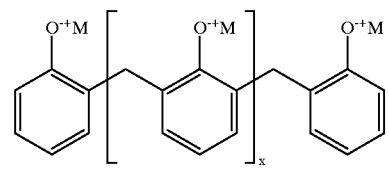

where M is a cation such as sodium, potassium, ammonium, or phosphonium and X ranges between 0 and 35. Fibers according to this embodiment of the invention have been tested experimentally in the case of fiber reinforced novolac-epoxy matrix composites.

For example, a novolac resin can be partially converted to the corresponding phenolate salt with KOH, then coated onto carbon fibers. The oligomeric phenolate nucleophilic initiator is thus immobilized on the fiber surface and can be used to initiate a phenol/epoxy matrix material once the fibers and matrix materials are combined. Alternatively, a poly(amic acid) salt with a tertiary phosphonium cation can be applied to carbon fibers. Then, in the oven at the end of the fiber coating line, the poly(amic acid) is imidized, thus liberating the tertiary phosphine nucleophilic initiator for the matrix resin (to be applied later). This phosphine nucleophilic initiator is thus molecularly dispersed within the polyimide fiber coating. As discussed below, carbon fiber reinforced novolac-epoxy composite panels can be generated by a melt pre-pregging method using phosphine nucleophilic initiators. In still another alternative, a carboxylate modified poly(hydroxyether) with a tertiary phosphonium cation can be coated onto carbon fibers. Then, in the oven at the end of the fiber coating line, the carboxylate modified poly(hydroxyether) is crosslinked, thus liberating the tertiary phosphine nucleophilic initiator for the matrix resin (again, to be applied later). Thus, the tertiary phosphine nucleophilic initiator is molecularly dispersed in the fiber coating. In this case, all of the carboxylate groups are not reacted in the crosslinking step. Thus, some carboxylate groups remain in the final fiber coating which also serve as nucleophilic initiators for the matrix cure. In another alternative, a carboxylate modified poly(hydroxy ether) with a sodium cation can be coated onto carbon fibers, and the carboxylate groups remaining after heating serve as nucleophilic initiators for the matrix cure.

In yet another embodiment of the invention, the surface of the fiber can be altered to create nucleophilic initiators thereon. For example, in the case of glass fibers, the fiber surface can be chemically treated with silane agents which themselves are nucleophilic initiators. For example, a water treated glass fiber surface can be treated with aminopropyltrimethyoxysilane and heated. This produces a glass surface containing a tertiary amine nucleophilic initiator for the thermosetting phenolic/epoxy matrix resin on the fiber surface.

In the Examples below, carbon fibers have been treated with coatings that contain or can be used to create nucleophilic initiators on the fiber surface. However, it will be understood by those of skill in the art that the invention can be practiced on a wide variety of fibers. Illustrative inorganic fibers include, without limitation: fiberglass fibers, cement fibers, asphalt fibers, metal fibers, shape memory alloy fibers, and the like. Illustrative organic fibers include, without limitation: carbon fibers, polyolefin fibers, polyester fibers, polyamide fibers, polyaramid fibers, cellulose fibers, nitrocellulose fibers, Goretex® fibers, Kevlar® fibers, and the like.

In the Examples below, the nucleophilic initiator containing fibers were used in conjunction with 65 wt % novolac/35 wt % epoxy matrix resin systems. However, it will be understood by those in the art that the fibers of this invention, and the methodology of this invention which includes combining nucleophilic initiator containing fibers with matrix materials, can be used in conjunction with a wide range of matrix materials and with wide ranging weight percentage relationships. For example, with novolac/epoxy thermosetting resin systems which are the preferred matrices for practicing this invention, the weight percentage of novolac to epoxy monomers can range from 1:99 to 99:1 with the most preferred ratio of weight percentages being between 25:75 and 75:25. The preferred novolak materials which can be used in the practice of this invention are linear or somewhat branched phenol-formaldehyde resins with functionality of about 3–10 phenols per molecule; however, a wide variety of other novolaks can be used in the practice of this invention including those discussed in U.S. Pat. No. 4,342,852 to Takeda which is herein incorporated by reference. The preferred epoxy materials which can be used in the practice of this invention include difunctional epoxies from Bisphenol A, tetrabromobisphenol A or bisphenol F, and epichlorohydrin, epoxidized novolac resins, siloxane modified epoxy resins, and epoxy resins containing phosphine oxide bonds; however, a wide variety of other epoxy materials can be used in the practice of this invention including those discussed in U.S. Pat. No. 4,328,150 to Kondow et al which is herein incorporated by reference. Other thermosetting matrix materials which can be used in the practice of this invention include: cyanate ester resins and cyanoacrylate resins.

The following examples illustrate the inventive fiber materials and inventive methodology, and should not in any way be considered limiting on the invention described herein.

EXAMPLE 1

A Fiber Coating Preparation With The Poly(amic acid) Containing The Nucleophilic Initiator Precursor Ultem type poly(amic acid) was synthesized under nitrogen in dry tetrahydrofuran from bisphenol-A dianhydride and m-phenylene diamine with phthalic anhydride as the endcapping reagent. After 24 hours at room temperature, the tetrahydrofuran was evaporated in a nitrogen atmosphere, then the poly(amic acid) was dried further in a vacuum oven. The dry poly(amic acid) was added to a solution of tetrahydrofuran and tris(2,4,6-trimethoxyphenyl)phosphine (1.1 moles based on moles of acid) to form a poly(amic acid) salt. This was stirred for about 4 hours to allow the salt to form. It remained heterogeneous until methanol was added to dissolve the salt. The solvent was then evaporated and the poly(amic acid) salt was soluble in methanol and formed a stable dispersion in a 30/70 methanol/water mix or a 15/85 NMP/water mix.

EXAMPLE 1B

Fiber Sizing With The Poly(imide) Containing The Nucleophilic Initiator

AS4 12K carbon fiber tow was sized with a 2 wt % solution of the poly(amic acid) salt described above in methanol and run through a purged line for three minutes to remove the methanol. The fiber was then run through a heated tower to imidize the poly(amic acid) and release the phosphine nucleophilic initiator into the polyimide. The fiber remained in the tower for 3 minutes at 260° C., which was sufficient for complete imidization of the poly(amic acid) salt.

EXAMPLE 1C

Hot-Melt Prepregging And Composite Fabrications Using The Fiber Material With The Poly(imide) Coating Containing The Nucleophilic Initiator A lab scale model 30 prepregger manufactured by Research Tools Corporation, Ovid, Mich. was used in composite preparation. In this apparatus, the sized carbon fiber tow was passed through a wedged-slit die at the bottom of a heated resin pot containing the matrix resin, a blend of 65 wt % phenolic novolac and 35 wt % epoxy. The resin was degassed at 160° C. for about 2 minutes prior to use. The wetted tow was then passed between a pair of flattening pins and around a guide roller before being wound on a drum. The flattening pins and the guide rollers were independently heated. The optimum set-point temperature of the resin pot, flattening pin, and roller was determined by viscosity data to be 140° C. This temperature was necessary to give a low enough melt viscosity to process the material. Low melt viscosity of the resin systems is critical to permit good wet-out of the reinforcing fiber tows and yield uniform resin content. The resin viscosity in the resin pot did not increase significantly over the approximately 2 hour period at 140° C. The prepreg plies were then cut and placed in a metal mold and cured 20 minutes at 180° C., then 10 minutes at 200° C.

EXAMPLE 2A

Fiber Coating Preparation With The Carboxylate Modified Poly(hydroxyether) Containing The Nucleophilic Initiator Precursor A poly(hydroxyether)derived from bisphenol-A and epichlorohydrin was modified to contain the nucleophilic initiator precursor in the following manner. The poly (hydroxyether) (one equivalent of pendent hydroxyls), phthalic anhydride (1.05 moles) and dimethylaminopyridine (0.05 moles) were refluxed in dry tetrahydrofuran for 48 hours. This reaction can also be run using succinic anhydride in place of phthalic anhydride at room temperature for 48 hours. The solvent was evaporated under nitrogen, then the modified polymer was dried under vacuum. The product of this step contained 20% repeat units with hydroxyl pendent groups and 80% repeat units with carboxylic acid pendent groups. The percentage carboxylic acid pendent groups can be controlled by the concentration of the anhydride and the time and temperature of the reaction. This product was dissolved in tetrahydrofuran along with 1.1 mole tris (trimethoxyphenyl)phosphine per equivalent of carboxylic acid to form the salt.

EXAMPLE 2B

Fiber Sizing With The Carboxylate Modified Poly (hydroxyether) Containing The Nucleophilic Initiator Precursor

[1] AS4 12K carbon fiber tow was sized with a 2 wt % solution of modified poly(hydroxyether)salt described above in a 50/50 wt/wt NMP/water solution, then heated for five minutes at 220° C. in the heating tower of the fiber coating line. During the heating step, a portion of the carboxyl groups crosslink by reacting with pendent hydroxyl groups thus liberating the 3° phosphine nucleophilic initiator into the crosslinked fiber coating. The remaining carboxylate groups also serve as nucleophilic initiators for the matrix resin (to be applied later in the composite processing step).

[2] AS4 12K carbon fiber tow was sized with a 2 wt % dispersion in water of modified poly(hydroxyether) salt containing a sodium cation, then heated for five minutes at 220° C. in the heating tower of the fiber coating line. During the heating step, a portion of the carboxyl groups crosslink by reading with pendent hydroxyl groups. The remaining carboxylate groups serve as nucleophilic initiators for the matrix resin (to be applied later in the composite processing step).

EXAMPLE 2C

Hot-Melt Prepregging And Composite Fabrication Using The Fiber Material With The Modified Poly (hydroxyether) Coating Containing The Nucleophilic Initiator A lab scale model 30 prepregger manufactured by Research Tools Corporation, Ovid, Mich. was used in composite preparation. In this apparatus, the sized carbon fiber tow was passed through a wedge-slit die at the bottom of a heated resin pot containing the matrix resin, a blend of 65 wt % phenolic novolac and 35 wt % epoxy. The resin was degassed at 160° C. for about 2 minutes prior to use. The wetted tow was then passed between a pair of flattening pins and around a guide roller before being wound on a drum. The flattening pins and the guide rollers were independently heated. The optimum set-point temperature of the resin pot, flattening pin, and roller was determined by viscosity data to be 140° C. This temperature was necessary to give a low enough melt viscosity to process the material. Low melt viscosity of the resin systems is critical to permit good wet-out of the reinforcing fiber tows and yield uniform resin content. The resin viscosity in the resin pot did not increase significantly over the approximately 2 hour period at 140° C. The prepregs were then cut and placed in a metal mold and cured 20 minutes at 180° C., then 20 minutes at 200° C. (for example 2B for #1) and 1 hour at 180° C. then 1 hour at 200° C. (for example 2B for #2).

EXAMPLE 3A

Fiber Coating Preparation With The Novolac Phenolate Salt Nucleophilic Initiator A phenol-formaldehyde novolac oligomer and 1 mole KOH per 2 equivalents phenol were mixed in water to form a 1,5 wt % solution of nucleophilic initiator in the water. A second solution was prepared in a similar manner except at a concentration of 0.9 wt % in water.

EXAMPLE 3B

Fiber Sizing With The Novolac Phenolate Salt Nucleophilic Initiator

AS4 12K carbon fiber tow was sized with a 1.5 wt % aqueous solution (and alternately the 0.9 wt % solution) of the novolac phenolate salt nucleophilic initiator described above, then dried.

EXAMPLE 3C

Hot-Melt Prepregging And Composite Fabrication Using The Fiber Material With The Novolac Phenolate Salt Nucleophilic Initiator A lab scale model 30 prepregger manufactured by Research Tools Corporation, Ovid, Mich. was used in composite preparation. In the apparatus, the sized carbon fiber tow was passed through a wedge-silt die at the bottom of a heated resin pot containing the matrix resin, a blend of 65 wt % phenolic novolac and 35 wt % epoxy. The resin was degassed at 160° C. for about 2 minutes prior to use. The wetted tow was then passed between a pair of flattening pins and around a guide roller before being wound on a drum. The flattening pins and the guide rollers were independently heated. The optimum set-point temperature of the resin pot, flattening pin, and roller was determined by viscosity data to be 140° C. This temperature was necessary to being a low enough melt viscosity to process the material. Low melt viscosity of the resin systems is critical to permit good Wet-out of the reinforcing fiber tows and yield uniform resin content. The prepregs were then cut and placed in a metal mold and cured 30 minutes at 180° C., then 30 minutes at 200° C.

Results

Phenolic-epoxy networks have been shown to have superior fire resistance as well as good mechanical properties, but there is difficulty in processing them using the conventional methods. In order to melt process these materials, high temperatures are needed to achieve a workable viscosity. If the nucleophilic initiator for the matrix is in the resin during the processing step, the processing window is less than five minutes and premature cure occurs, even with as low as 0.1 mole % initiator (relative to moles of epoxy).

The glass transition temperatures of the cured composite panels, determined from the peak in the tan δ (FIG. 1) measured by dynamic mechanical analysis (DMA), indicate that sample (3) was fully cured within the curing cycle used, whereas sample (1) had not reached full cure after three hours. In addition, the panels from the polyimide-initiator sized fibers have increased transverse flexural strength over the panel prepared using the unsized, fiber material (no added initiator).

TABLE 1

Thermal and mechanical properties of panels related to cure schedule and nucleophilic initiator concentration.

| 65 wt % novolac/35 wt % epoxy matrix with AS4 carbon fibers | nucleophilic initiator concentration (based on equivalents of epoxy) | cure cycle | Tg (° C.) | Transverse Flexural Strength (MPa) |
|---|---|---|---|---|
| No fiber coating (sample 1) | none | 200° C. (1 hour) 220° C. (2 hours) | 124 | 83 ± 5 |
| with control epoxy fiber coating (sample 2) | none | 200° C. (1 hour) 220° C. (3 hours) | 132 | 100 ± 8 |
| with poly(imide) fiber coating (example 1) (sample 3) | 3.2 mole % | 180° C. (20 min) 200° C. (10 min) | 130 | 102 ± 9 |
| with modified poly(hydroxyether) fiber coating (example 2) | 2–3 mole % | 180° C. (20 min) 200° C. (20 min) | 134 | |
| with novolac phenolate fiber coating (example 3) | 5.2 mole % | 180° C. (30 min) 200° C. (30 min) | 135 | |
| with novolac phenolate fiber coating (example 3) | 3.0 mole % | 180° C. (30 min) 200° C. (30 min) | 135 | |

TABLE 2

Composite mechanical properties related to cure schedule and nucleophilic initiator concentration.

| 65 wt % novolac/35 wt % epoxy matrix with AS4 carbon fibers | nucleophilic initiator concentration (based on equivalents of epoxy) | cure cycle | $G_{1c}$ (J/m$^2$) | $G_{2c}$ (J/m$^2$) |
|---|---|---|---|---|
| with control epoxy fiber coating | none | 200° C. (1 hour) 220° C. (3 hours) | 573 ± 46 | 1410 ± 302 |
| with poly(imide) fiber coating | none | 200° C. (1 hour) | 695 ± 83 | 1254 ± 64 |
| with poly(imide) fiber coating (example 1) | 3.2 mole % | 220° C. (3 hours) 180° C. (20 min) 200° C. (10 min) | 542 ± 92 | 1224 ± 250 |

Figure 2:
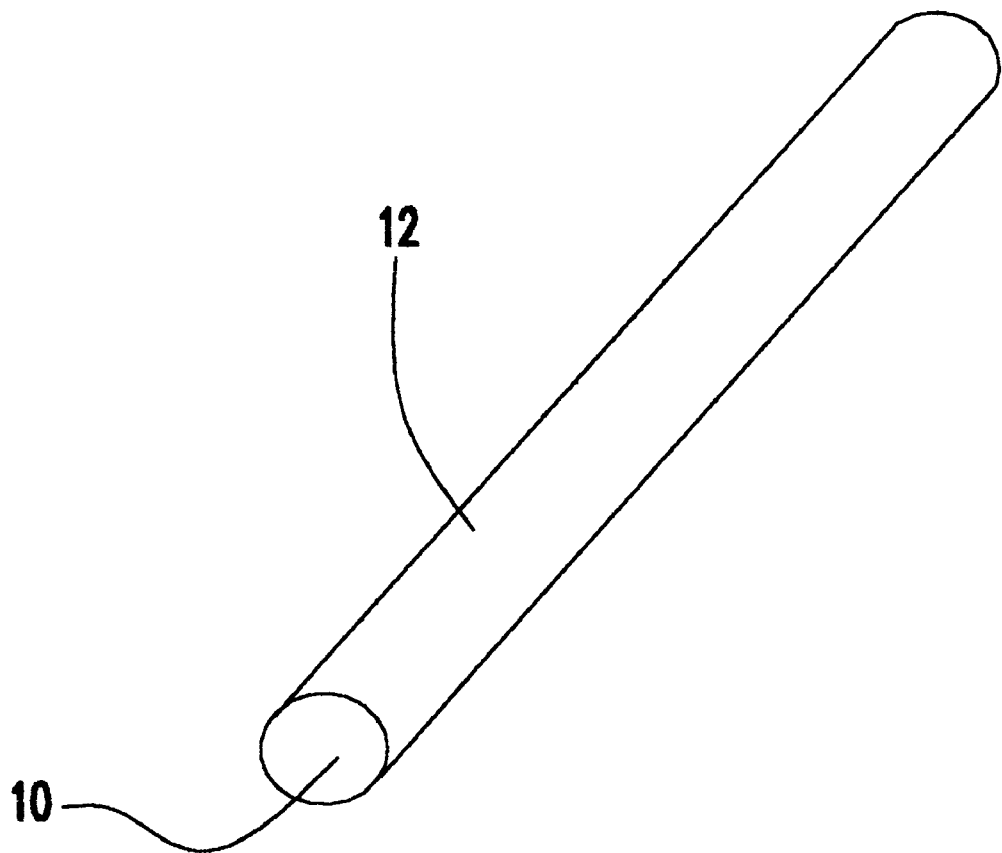
FIG. 2 is a schematic drawing of a fiber according to the invention.

FIG. 2 shows a generalized drawing of a fiber 10 which includes nucleophilic initiators on its surface 12. Once the fiber 10 is combined with a thermosetting resin, such as phenol-epoxy resins, the nucleophilic initiators initiate cure of the matrix material.

While the invention has been described in terms of its preferred embodiments, those skilled in the art will recognize that the invention can be practiced with modification within the spirit and scope of the appended claims.

We claim:

1. A fiber material for use in manufacturing fiber reinforced polymeric materials, comprising:
   a surface which can be brought into contact with a thermosetting matrix material; and
   a nucleophilic initiator positioned on said surface.

2. The fiber material of claim 1 further comprising a polymeric coating on said surface, said nucleophilic initiator being present in said polymeric coating.

3. The fiber material of claim 1 wherein said nucleophilic initiator is a byproduct of an imidization reaction of a poly(amic acid) salt coated on said surface.

4. The fiber material of claim 3 wherein said byproduct is tris(trimethoxyphenyl)phosphine.

5. The fiber material of claim 1 wherein said nucleophilic initiator is a product of a reaction between a base and a phenolic group.

6. The fiber material of claim 5 wherein said product is

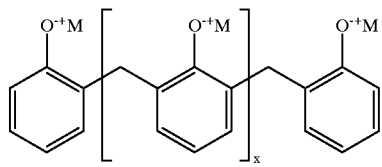

where M is a cation and x is a number between 0 and 35.

7. The fiber material as in claim 6 wherein M is selected from the group consisting of Na, K, ammonium, and phosphonium.

8. The fiber material of claim 1 wherein said nucleophilic initiator is a carboxylate.

9. The fiber material of claim 1 wherein said fiber material is a glass and wherein said nucleophilic initiator is charged on said surface.

10. The fiber material of claim 2 wherein said nucleophilic initiator comprises less than 2% by weight of a coating on said surface.

11. A method of fabricating fiber reinforced thermosetting composite materials, comprising the steps of:

forming nucleophilic initiators on a surface of fiber materials; and combining said fiber materials with a thermosetting resin, said nucleophilic initiators on said surface of said fiber materials initiating polymerization of said thermosetting resin to form a fiber reinforced thermosetting composite material.

12. The method of claim 11 wherein said thermosetting resin is an novolac/epoxy resin.

13. The method of claim 11 wherein said fiber materials are glass materials and wherein said forming step is performed by treating said glass materials to create said nucleophilic initiators.

14. The method of claim 11 wherein said forming step comprises the step of coating said fiber materials with a polymer containing said nucleophilic initiators.

15. The method of claim 11 wherein said forming step comprises the steps of coating said fiber materials with a polymer material, and then treating said polymer material to create said nucleophilic initiators.

* * * * *